(12) United States Patent
Sekigawa

(10) Patent No.: US 6,463,569 B1
(45) Date of Patent: Oct. 8, 2002

(54) METHOD FOR DESIGNING A LAYOUT OF A LARGE SCALE INTEGRATED (LSI) CIRCUIT AND A RECORDING MEDIUM INCORPORATING THEREIN A PROGRAM FOR SUCH DATA PROCESSING

(75) Inventor: Kazunari Sekigawa, Nagano (JP)

(73) Assignee: Shinko Electronic Industries Co., Ltd., Nagano (JP)

( * ) Notice: Subject to any disclaimer, the term of this patent is extended or adjusted under 35 U.S.C. 154(b) by 148 days.

(21) Appl. No.: 09/598,497

(22) Filed: Jun. 22, 2000

(30) Foreign Application Priority Data

Jun. 22, 1999 (JP) .......................................... 11-175472

(51) Int. Cl.[7] .......................... G06F 17/50; G06F 9/455
(52) U.S. Cl. .............................................. 716/2; 716/11
(58) Field of Search ....................................... 716/2, 11

(56) References Cited

U.S. PATENT DOCUMENTS

| | | | | | |
|---|---|---|---|---|---|
| 5,459,827 A | * | 10/1995 | Allouche et al. | ............ | 707/513 |
| 5,473,546 A | * | 12/1995 | Filseth | ............ | 716/8 |
| 5,481,473 A | * | 1/1996 | Kim et al. | ............ | 716/5 |
| 5,640,497 A | * | 6/1997 | Woolbright | ............ | 716/11 |
| 5,885,734 A | * | 3/1999 | Pierrat et al. | ............ | 430/5 |
| 6,009,250 A | * | 12/1999 | Ho et al. | ............ | 716/5 |
| 6,009,251 A | * | 12/1999 | Ho et al. | ............ | 716/5 |
| 6,011,911 A | * | 1/2000 | Ho et al. | ............ | 716/5 |
| 6,066,179 A | * | 5/2000 | Allan | ............ | 716/4 |
| 6,289,412 B1 | * | 9/2001 | Yuan et al. | ............ | 711/1 |
| 2001/0016937 A1 | * | 8/2001 | Watanabe | ............ | 716/19 |

* cited by examiner

Primary Examiner—Vuthe Siek
Assistant Examiner—A. M. Thompson
(74) Attorney, Agent, or Firm—Staas & Halsey LLP

(57) ABSTRACT

The present invention provides a method of data processing for calculating and storing in a memory to deform a data structure of layout designing data in which cells having geometry information and also having reference information to refer to geometry information of another cell are hierarchically combined with each other.

2 Claims, 2 Drawing Sheets

METHOD FOR DESIGNING A LAYOUT OF A LARGE SCALE INTEGRATED (LSI) CIRCUIT AND A RECORDING MEDIUM INCORPORATING THEREIN A PROGRAM FOR SUCH DATA PROCESSING

BACKGROUND OF THE INVENTION

1. Field of the Invention

The present invention relates to a data processing method for designing a layout of a large scale integrated (LSI) circuit and a recording medium incorporating therein a program for such data processing. More particularly, the present invention relates to a data processing method for calculating and storing in a memory to deform a data structure of layout designing data in which cells having geometry information and also having reference information to refer to geometry information of other cells are hierarchically combined with each other.

2. Description of the Related Art

Data for designing a physical layout for designing LSI are composed in such a manner that data, which are referred to as cells, are hierarchically combined with each other. Each cell has geometry information and reference information used for referring to geometry information of another cell. In the case where a photo-mask or printed board is manufactured by using such layout designing data, in order to conduct logical operations (different logical operations include such ones as OR, AND, XOR, NOT, SUB, and positive- and negative-resizing) between the figures of the cells, the hierarchical structure is collapsed, that is, the hierarchical structure is deformed to be a flat structure, and the calculation is conducted.

Each cell C is composed of geometry information "f", which is directly owned by the cell concerned, and also composed of reference information (s, a) for referring to another cell. The relation between these pieces of information is expressed by the following expression (1).

$$C = f + (s, a) \quad (1)$$

In the above expression, "s" indicates that the geometry information "f" of another cell is simply referred to once, that is, "s" includes a piece of positional information for directing movement, rotation and reflection of geometry information "f". In the above expression, "a" indicates that geometry information "f" to be referred to should be referred to as two-dimensional array arrangement of n columns and m rows. Note that "s" and "a" can be applied not only to "f" but also to "s" or "a" of another cell.

In short, cascading hierarchical reference can be represented by arbitrary multiplication of "s" and "a". In this case, the reason why "f" is expressed by a bold letter is that "f" can be generally processed as a vector composed of a plurality of polygons. The reason why "(s, a)" are expressed by bold letters is that "(s, a)" can be processed as vectors having a position (direction) and intensity (quantity of data).

FIG. 4 is a view schematically showing a model of the composition in which a plurality of cells compose one set of layout designing data, which are correlated with each other, in a hierarchical structure.

FIG. 4 is interpreted as follows. (1) Cell C0 refers to cell C1 by the arrangement of a1. Also, cell C0 refers to cell C2 by the arrangement of a2. At this time, cell C0 is not referred by any other cell. Therefore, cell C0 is referred to as "top cell Ct".

(2) Cell C1 singly refers to cell C3 by S1, S2, S3 and S4, that is, cell C1 singly refers to cell C3 four times in total. Further, cell C1 singly refers to cell C4 by S5.

(3) Cell C2 refers to cell C3 by a3. Cell C2 refers to cell C4 by a6. Cell C2 singly refers to cell C4 by s6 and s7 two times in total.

(4) Cells C3 and C4 are referred to by other cells and do not refer to other cells by themselves. Therefore, cells C3 and C4 are referred to as atom cells Ca.

The above relations are expressed by the following expression (2).

$$C0 = f0 + a1C1 + a2C2 \quad C1 = f1 + s1C3 + s2C3 + s3C3 + s4C3 + s5C4 \quad C2 = f2 + a3C3 + a6C4 + s6C4 + s7C4 \quad C3 = f3 \quad C4 = f4 \quad (2)$$

Conducting operation (OR processing) by collapsing the hierarchical structure is the same as expressing top cell Ct=C0 only by f, s and a. When expression (2) is actually expanded, the following expression (3) can be obtained, the right side of which is composed of 12 terms. In this connection, the sign + expresses that the developed geometry information must be subjected to OR operation.

$$C0 = f0 + a1f1 + a2f2 + a1s1f3 + a1s2f3 + a1s3f3 + a1s4f3 + a1s5f4 + a2a3f3 + a2a6f4 + a2s6f4 + a2s7f4 \quad (3)$$

In expression (3), when not less than two operators act on f as shown by a2a3f3, the operators act in the order of closeness to f. That is:

$$a2a3f3 = (a2(a3f3))$$

Therefore, f3 is referred by the arrangement of a3. The result is referred by the arrangement of a2. In this connection, the commutative law of operators is not established. That is:

$$aiajf \neq ajaif(ai \neq aj)$$

The actual layout designing data is complicated in many cases. Therefore, it is not unusual that the number of terms on the right side of the expression (3) exceeds one million. An OR operation is conducted after these terms have been classified by a spatial positional relation. Therefore, it is necessary that all these terms are stored in the memory. That is, when the number of the terms on the right side of the expression (3) is large, the memory requirement for computation must be increased. Accordingly, it takes a long operation time and, further the manufacturing cost is increased.

SUMMARY OF THE INVENTION

The present invention has been accomplished to solve the above problems of the prior art.

It is an object of the present invention to provide a data processing method and a recorded medium incorporating therein a program capable of reducing the operation processing time by deforming and simplifying the data structure of layout designing data composed of cells which are hierarchically combined with each other.

In order to solve the above problems, the present invention is composed as follows.

The present invention provides a method of data processing for calculating and storing in a memory so as to deform a data structure of layout designing data in which cells having geometry information of the cells concerned and also having reference information to refer to geometry information of another cell are hierarchically combined with each other, the method of data processing being characterized in that: cell Cx of an upper layer for referring to atom cell Ca, cell Ca having only geometry information and not referring to geometry information of a lower layer by itself, is made to have the geometry information of atom cell Ca by copying; reference information of cell Cx is deleted and cell Cx is replaced with C'x; cell Cy of an upper layer, which refers to geometry information of cell C'x concerned, is made to have geometry information of cell C'x by copying; reference information of cell Cy is deleted and cell Cy is replaced with cell C'y; and the above operation is repeated so that the data structure hierarchically combined from the top cell Ct of the uppermost layer, which is not referred by any other cell, to the atom cell Ca of the lowermost layer, is deformed and stored.

In this case, it is preferable that only when a quantity g of data obtained from geometry information and reference information of cells Cx, Cy, ..., which refer to the cells of a lower layer including atom cell Ca, is not more than threshold value w which is set for each hierarchy to which each cell Cx ... Cy, belongs, geometry information of the lower layer cell is made to copy on geometry information of each cell Cx, Cy, and reference information is deleted and each cell Cx, Cy is replaced with C'x, C'y, ...

According to another aspect of the present invention is to provide a recorded medium incorporating therein a program to carry out the above-mentioned method.

DETAILED DESCRIPTION OF THE INVENTION

Referring to the appended drawings, a preferred embodiment of the present invention will be explained in detail as follows.

Figure 1:
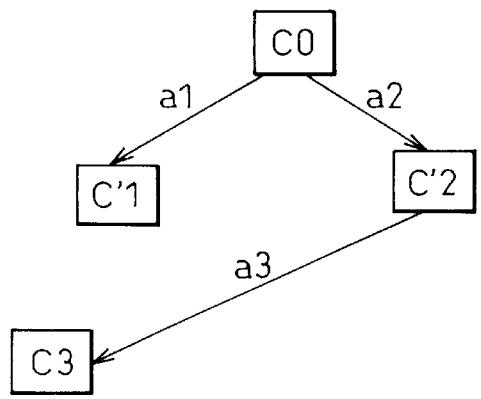
FIG. 1 is a view showing an model of a state in wich the data structure of layout designing data shown in FIG. 4 is deformed.
Figure 2:
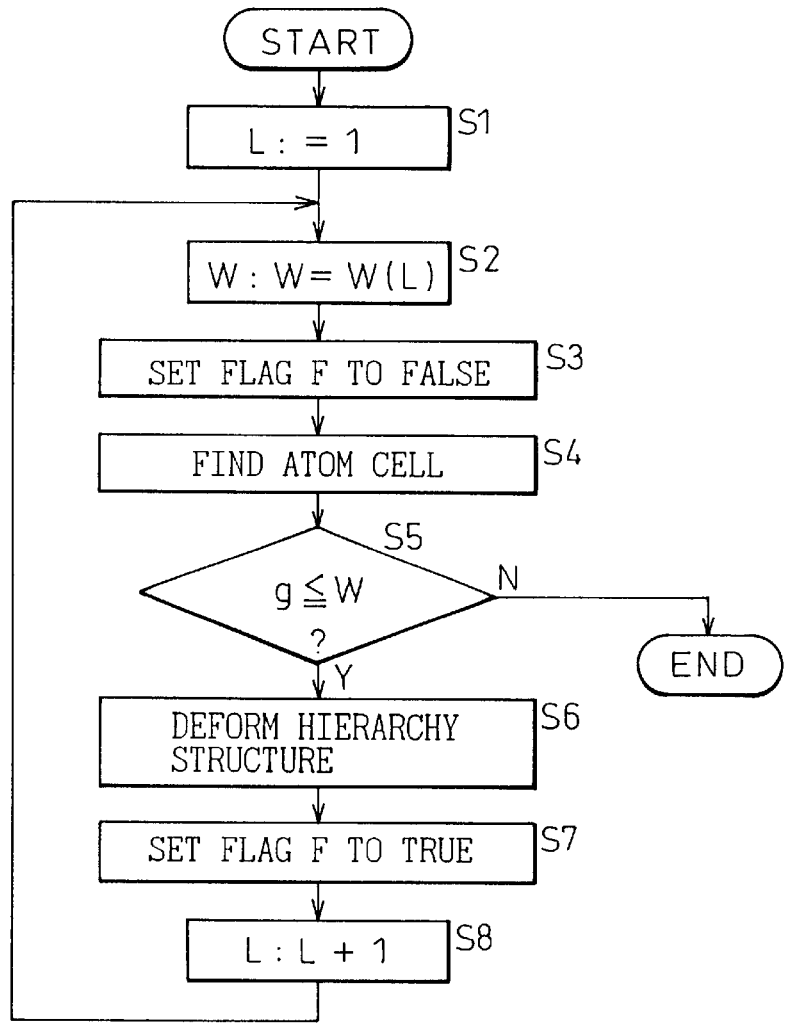
FIG. 2 is a flow chart showing a process of deforming hierarchical structure.
Figure 3:
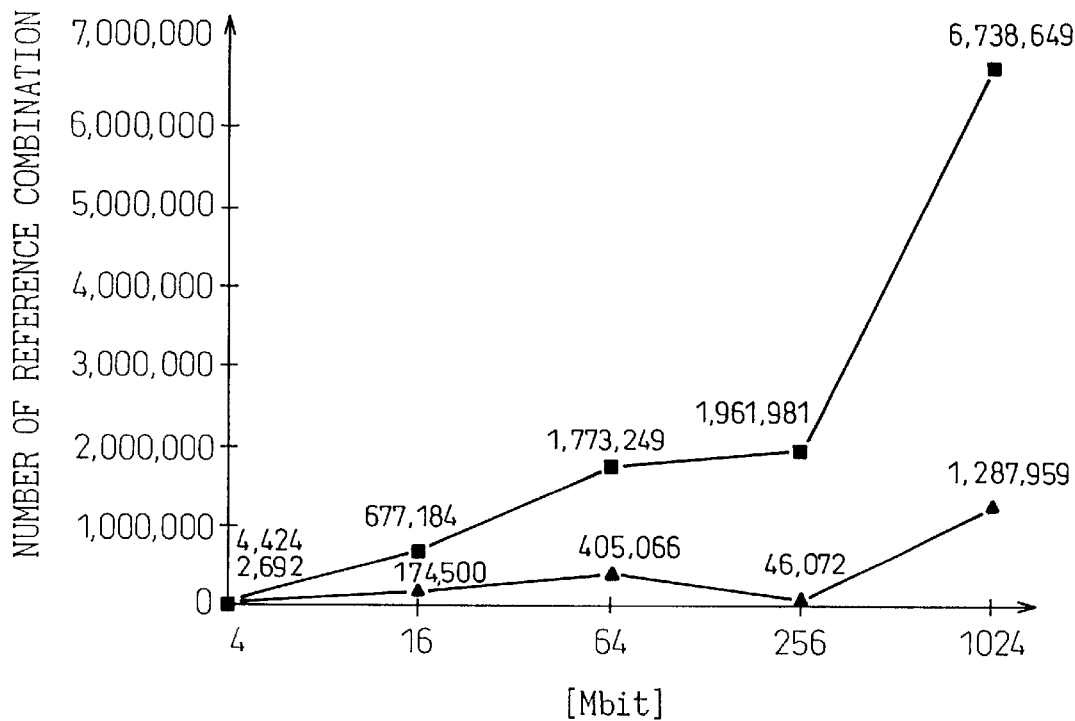
FIG. 3 is a graph showing a comparison of the number of terms of the operational expression in which the layout designing data is expanded according to whether or not the hierarchical structure is deformed.
Figure 4:
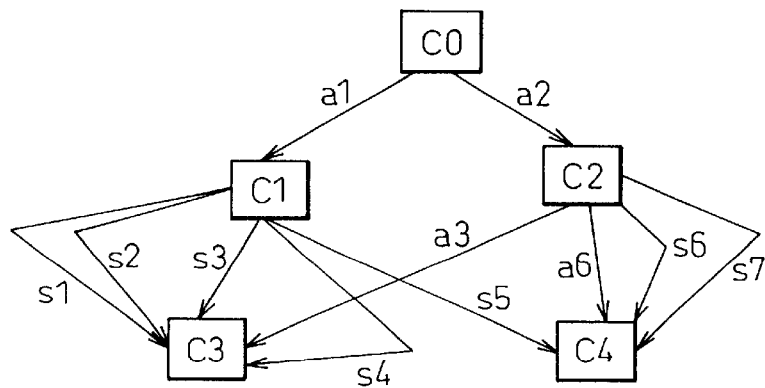
FIG. 4 is a view showing a model of the data structure of the conventional layout designing data.

FIG. 1 is a view schematically showing a model of a state in which the data structure of layout designing data shown in FIG. 4 is deformed. FIG. 2 is a flow chart showing a process of deforming a hierarchical structure. FIG. 3 is a graph showing a comparison of the number of terms of the operation expression in which the layout designing data is expanded according to whether or not the hierarchical structure is deformed.

First, referring to FIG. 1, which is a view schematically showing a model, an example of deforming the data structure of the layout design data shown in FIG. 4 will be explained below.

Concerning each cell having a data structure combined hierarchically, the complication of combining the reference operators relates to the number of terms of the operational expression. Therefore, the algorithm for simplifying the reference information (s, a) to refer to other cells is established.

For example, geometry information f3 is copied on upper layer cell Cx=C1 which refers to "atom cell" Ca=C3=f3, in FIG. 4. At the same time, pieces of reference information of s1, s2, s3 and s4 are deleted as shown in FIG. 1. In the same manner, geometry information f4 is copied on upper layer cell Cx=C1 which refers to atom cell Ca=C4=f4. At the same time, a piece of reference information of s5 is deleted and replaced by cell C'x=C'1 as shown in FIG. 1. That is, the following operation is conducted.

$$C'1 = f1 + s1f3 + s2f3 + s3f3 + s4f3 + s5f4 = f'1 \tag{4}$$

In this case, it is preferable that pieces of geometry information f are locally subjected to OR processing at this stage so as to make the number of terms on the right side to be one.

In FIG. 4, geometry information f4 is copied on upper layer cell Cx=C2 which refers to atom cell Ca=C4=f4. At the same time, pieces of reference information of a6, s6 and s7 are deleted and replaced with cell C'x=C'2 as shown in FIG. 1. That is, the following operation is conducted.

$$\begin{aligned} C'2 &= f2 + a6f4 + s6f4 + s7f4 \\ &= f'2 \end{aligned} \tag{5}$$

In this case, it is preferable that pieces of geometry information f are locally subjected to OR processing at this stage so as to make the number of terms on the right side to be one.

An operation necessary for obtaining the above expressions (4) and (5) can be carried out in a short period of time because the number of terms is small and an amount of reference information a with respect to the arrangement is very small since each piece of geometry information f to be copied belongs to atom cell Ca.

When the layout designing data is expanded from top cell Ct=C0 which refers to cells C'1 and C'2 as an arrangement, the following expression (6) is obtained.

$$C0 = f0 + a1f'1 + a2f'2 + a2a3f3 \tag{6}$$

The right side of expression (6) is composed of four terms. Therefore, it can be understood that the expression (6) is simpler than the expression (3).

When the reference relation between the cells of the layout designing data is simplified and the number of combinations is reduced as described above, the number of terms of the development expression can be remarkably reduced in the case where the hierarchical structure is collapsed and expanded for conducting the operation processing (OR processing) of the layout design data.

Therefore, when a photo-mask or printed circuit board is manufactured by using the layout design data, the operation processing time in which a expanding expression for developing the layout designing data such as a format conversion in the case of making mask data for exposure from CAD data is used, can be reduced. When the layout design data is developed and an OR operation processing is conducted, it is possible to reduce the amount of memory necessary for each term of the expanded expression. Therefore, the cost of the operation procession can be reduced.

For example, the layout design data is expanded on the upper layer cell Cx (=C1, C2) which refers to geometry information f which is owned by atom cell Ca (=C3, C4), and replaced with cell C'x (=C'1, C'2), an amount of geometry information which is owned by cell C'x (=C'1, C'2) is increased, so that the memory space is increased. Therefore, only when an amount of data "g" obtained from the geometry information and reference information of cells Cx, Cy, ... which refer to the lower layer cell including atom cell Ca is not more than threshold value W which is set for each hierarchy to which each cell of Cx, Cy, . . . belongs, the geometry information of the lower layer cell is duplicated and merged into the existing geometry information of cells Cx, Cy, . . . , thus expansion takes place, and at the same time the reference information is deleted and Cx, Cy, . . . are replaced with cells C'x, C'y, . . . In this case, threshold value w is determined as follows.

For example, function W(L) for determining threshold value W, where L (an independent variable) is level in hierarchy from bottom and can be represented by an integer number (zero for the lowermost layer), is set as follows.

$$W(L)=1000L+1000$$

An amount g of information, which is owned by the upper layer cells Cx, Cy, . . . which refer to the lower layer cells including atom cell Ca, is calculated as follows by the particular geometry information f, which is owned by the lower layer cell including atom cell Ca, and reference information (s, a) for atom cell Ca.

g=(number of total bytes of geometry information f owned by Ca)×(total number of times of reference from Cx, Cy, . . . )

(total number of times of reference from Cx, Cy, . . . : once if the operator referring to Ca is s; and number of columns×number of rows if the operator referring to Ca is a.)

Function "g" expresses how the weights of the upper layer cells Cx, Cy, . . . increase in the case where an amount of information owned by each atom cell Ca is expanded to the upper layer cells Cx, Cy, . . . On the other hand, function W(L) linearly increases with respect to level L. Function W(L) gives a threshold value W for determining whether or not the lower layer cell's geometry information f including atom cell Ca is to be expanded to the upper layer cells Cx, Cy, . . . As level L is increased, that is, as the hierarchy comes close to an upper layer, the amount of data of geometry information f (refer to as "weight of cell" or "weight" for simplicity) of cells Cx, Cy, . . . can abruptly increase due to cascading array references to their child cells. Therefore, it becomes possible for the "weight of cell" at a certain level L to exceed the threshold value W(L) determined at the level L, which disables further expansions upward traversing the hierarchy. Accordingly, processing of deforming the hierarchy structure is completed.

Referring to the flow chart shown in FIG. 2, the process of deforming the hierarchy structure of the layout design data will be explained below.

In step S1, variable L, which is referred to as level L, is initialized (L:=1). Next, the program proceeds to step S2, and threshold value W is calculated by function W(L) in which level L is used as an independent variable.

Next, the program proceeds to step S3, and a flag is set to false. After that, in step S4, the lower layer atom cell Ca is found from the hierarchy structure of the present layout designing data.

Weight g (g:=g(Ca, s, a)) of data of the upper layer cell Cx is calculated from geometry information f, which is specific to atom cell Ca found in step S3, and reference information (s, a) for atom cell Ca. In step S5, it is judged whether or not $g \leq W$. When $g \leq W$, the program proceeds to step S6, and geometry information f is copied on the upper layer cell Cx which refers to atom cell Ca, and at the same time reference information (s, a) of cell Cx is deleted and cell Cx is replaced with cell C'x so as to deform the hierarchy structure. That is, geometry information f of atom cell Ca is expanded to the upper layer cell Cx, so that geometry information f of atom cell Ca is owned by the upper layer cell Cx. Next, the program proceeds to step S7, and the flag is set to true. After that, the program proceeds to step S8, and level L is increased by 1 (L:=L+1). Then, the procedures of steps S2 to S8 are repeated. That is, the program returns to step S2, and threshold value W is calculated by function W(L+1) in which level (L+1) is used as an independent variable. Next, the weight g of data of cell C'x is calculated. When $g \leq W$, geometry information f of cell C'x is copied on the upper layer cell Cy which refers to geometry information f of cell C'x, and geometry information f of cell C'x is owned by the upper layer cell Cy, and at the same time, reference information (s, a) owned by cell Cy is deleted and cell Cy is replaced with cell C'y. The above operation is repeated, so that the processing shown in FIG. 2 is carried out with respect to all atom cells.

If g>W in step S5, for example, when geometry information f of atom cell Ca is copied on the upper layer cell Cx which refers to atom cell Ca, an amount of data exceeds threshold value W. Therefore, the processing of deforming the data structure is completed.

FIG. 3 is a graph on which the comparison of the number of terms on the right side of the expanded expression (3) from top cell Ct to atom cell Ca and also the comparison of the number of terms on the right side of the expanded expression (6) are shown in the following two cases. One is a case in which the hierarchical data structure deformation is applied to real-life layout design data for manufacturing semiconductor memory devices ranging over 4 M bits to 1024 M bits, and the other is a case in which the hierarchical data structure is not deformed. In FIG. 3, mark ■ expresses the number of terms of the expanded expression (3) in which the hierarchy structure is not deformed as explained in the conventional example before, and mark ▲ expresses the number of terms of the expanded expression (6) in which the hierarchy structure is deformed as explained in the present invention before. When the hierarchy structure is deformed as described above so that the reference information of cells can be simplified, the larger the amount of data is, the more greatly the expanded expression can be simplified. For example, in the case of 1024 M bits DRAM layout design data, it is possible to reduce the number of reference combination to 1/7 to 1/6 of that is observed when the hierarchical data structure deformation is not applied to.

According to the data processing method described above, when the data structure of the layout design data, in which the cells are hierarchically combined with each other, is deformed so that the combination of the reference information of the cells can be as simple as possible, the number of terms of the expanded expression can be reduced in the case of expanding the layout design data.

Due to the foregoing, in the case where a photo-mask or printed board is manufactured by using the layout designing data, when the exposure data is created from CAD data by means of format conversion, the operation processing time can be reduced in the case of logical operations (OR operation) by using the expanded expression of the layout designing data.

The preferred embodiments of the present invention are explained above. However, it should be noted that the present invention is not limited to the above specific embodiments. Concerning the processor used for deforming the data structure of the layout design data, it is possible to use a single processor or a multiple processor, or alternatively it is possible to use both a single processor and a multiple processor. Concerning the composition of the device, it is possible to use a stand-alone type processor, or alternatively a plurality of processors may be used being arranged in parallel with each other, that is, variations may be made by one skilled in the art without departing from the spirit and scope of the present invention.

What is claimed is:

1. A method of processing data for designing a physical layout of a large scale integrated circuit for calculating and storing in a memory to deform a data structure of layout design data in which cells having geometry information and also having reference information to refer to geometry information of another cell are hierarchically combined with each other, the method of data processing, comprising:

copying the geometry information of atom cell Ca onto upper layer cell Cx, which refers to atom cell Ca, cell Ca having only geometry information and not referring to geometry information of a lower layer by itself; deleting reference information of cell Cx; and replacing cell Cx with C'x; copying geometry information of cell C'x onto upper layer cell Cy, which refers to geometry information of cell C'x; deleting reference information of cell Cy; and replacing cell Cy with cell C'y; and repeating the copying, deleting, and replacing so that the data structure hierarchically combined from top cell Ct of the uppermost layer, which is not referred to by any other cell, to atom cell Ca of the lowermost layer, is deformed and stored, wherein only when a quantity g for an upper layer cell Cx, Cy is not more than a threshold value W, which is predetermined for each hierarchy level to which Cx, Cy belongs:

copying the geometry information of the lower layer cells referenced by Cx, Cy to the upper layer cell; and replacing the upper cell Cx, Cy with C'x, C'y, respectively, in which reference information to the lower layer cells has been deleted; where the value of g is calculated from (1) geometry information that Cx, Cy originally has, and (2) geometry information that is to be generated in the upper layer cell by copying the geometry information of the lower layer cells.

2. A recording medium incorporating therein a program of processing data for designing a physical layout of a large scale integrated circuit for calculating and storing in a memory to deform a data structure of layout design data in which cells having geometry information and also having reference information to refer to geometry information of another cell are hierarchically combined with each other, the program, which when executed, performs a method of data processing, comprising:

copying the geometry information of atom cell Ca onto upper layer cell Cx, which refers to atom cell Ca, cell Ca having only geometry information and not referring to geometry information of a lower layer by itself; deleting reference information of cell Cx; and replacing cell Cx with C'x; copying geometry information of atom cell C'x onto upper layer cell C'y; which refers to geometry information of cell C'x: deleting reference information of cell Cy; and replacing cell Cy with cell C'y; and repeating the copying, deleting, and replacing so that the hierarchically combined data structure is deformed and stored from the top cell Ct of the uppermost layer, which is not referred to by any other cell, to the atom cell Ca of the lowermost layer, wherein only when a quantity g for an upper layer cell Cx, Cy is not more than a threshold value W, which is predetermined for each hierarchy level to which Cx, Cy belongs:

copying the geometry information of the lower layer cells referenced by Cx, Cy to the upper layer cell; and replacing the upper cell Cx, Cy with C'x, C'y, respectively, in which reference information to the lower layer cells has been deleted; where the value of g is calculated from (1) geometry information that Cx, Cy originally has, and (2) geometry information that is to be generated in the upper layer cell by copying the geometry information of the lower layer cells.

\* \* \* \* \*

UNITED STATES PATENT AND TRADEMARK OFFICE
CERTIFICATE OF CORRECTION

PATENT NO.   : 6,463,569 B1
DATED        : October 8, 2002
INVENTOR(S)  : Kazunari Sekigawa It is certified that error appears in the above-identified patent and that said Letters Patent is hereby corrected as shown below:

<u>Title page,</u>
Item [73], Assignee, change "Electronic" to -- Electric --.

Signed and Sealed this

Third Day of June, 2003

JAMES E. ROGAN
*Director of the United States Patent and Trademark Office*